(12) United States Patent
Lopez et al.

(10) Patent No.: US 11,898,449 B2
(45) Date of Patent: Feb. 13, 2024

(54) TURBINE CONTROL SYSTEM

(71) Applicant: ABB Schweiz AG, Baden (CH)

(72) Inventors: Camilo Lopez, Export, PA (US); Mark Foltz, Pittsburgh, PA (US); Steve Miller, Pittsburgh, PA (US)

(73) Assignee: ABB Schweiz AG, Baden (CH)

( * ) Notice: Subject to any disclaimer, the term of this patent is extended or adjusted under 35 U.S.C. 154(b) by 723 days.

(21) Appl. No.: 17/092,525

(22) Filed: Nov. 9, 2020

(65) Prior Publication Data
US 2021/0054789 A1 Feb. 25, 2021

Related U.S. Application Data

(63) Continuation of application No. PCT/US2019/031445, filed on May 9, 2019.
(Continued)

(51) Int. Cl.
*F01C 20/28* (2006.01)
*G01P 21/02* (2006.01)
(Continued)

(52) U.S. Cl.
CPC .............. *F01C 20/28* (2013.01); *F01D 17/06* (2013.01); *F01D 17/145* (2013.01); *F01D 17/26* (2013.01); *F01D 21/02* (2013.01); *F01K 13/003* (2013.01); *F01K 13/02* (2013.01); *F02C 7/232* (2013.01); *F02C 9/263* (2013.01); *F02C 9/28* (2013.01); *F02C 9/52* (2013.01); *F02C 9/54* (2013.01); *F16K 37/0041* (2013.01); *F16K 37/0083* (2013.01); *G01P 21/02* (2013.01); *G01R 31/2829* (2013.01); *H02J 3/381* (2013.01);
(Continued)

(58) Field of Classification Search
None
See application file for complete search history.

(56) References Cited

U.S. PATENT DOCUMENTS 2,827,020 A   3/1958 Cook
3,597,653 A   8/1971 Moore et al.
(Continued)

FOREIGN PATENT DOCUMENTS

CN   1678913 A   10/2005
EP   1191190 A1   3/2002
(Continued)

OTHER PUBLICATIONS

European Patent Office, Extended European Search Report in European Patent Application No. 19800872.4, 8 pp. (dated Feb. 11, 2022).
(Continued)

*Primary Examiner* — Carlos R Ortiz Rodriguez
(74) *Attorney, Agent, or Firm* — Leydig, Voit & Mayer, Ltd.

(57) ABSTRACT

A turbine control system is provided for decreasing the response time between readings of the speed of the turbine and changing a valve position in response thereto. The speed control system includes a speed probe that detects the speed of the turbine and a turbine valve that controls the flow of fluid or gas from or to the turbine. A controller receives a speed signal from the speed probe and sends valve position commands to the turbine valve. The controller also sends support functions to the turbine valve. The controller sends the valve position commands at a faster rate than the support functions.

20 Claims, 4 Drawing Sheets

Related U.S. Application Data

(60) Provisional application No. 62/669,070, filed on May 9, 2018, provisional application No. 62/669,063, filed on May 9, 2018, provisional application No. 62/669,057, filed on May 9, 2018, provisional application No. 62/669,042, filed on May 9, 2018, provisional application No. 62/669,048, filed on May 9, 2018.

(51) Int. Cl.

| | |
|---|---|
| *G01R 31/28* | (2006.01) |
| *F01D 17/06* | (2006.01) |
| *F02C 9/28* | (2006.01) |
| *F01D 21/02* | (2006.01) |
| *H02J 3/38* | (2006.01) |
| *H02J 3/40* | (2006.01) |
| *F01K 13/00* | (2006.01) |
| *F01K 13/02* | (2006.01) |
| *F16K 37/00* | (2006.01) |
| *F02C 7/232* | (2006.01) |
| *F02C 9/26* | (2006.01) |
| *F02C 9/52* | (2006.01) |
| *F02C 9/54* | (2006.01) |
| *F01D 17/14* | (2006.01) |
| *F01D 17/26* | (2006.01) |

(52) U.S. Cl.
CPC ............ *H02J 3/40* (2013.01); *F05D 2220/31* (2013.01); *F05D 2260/80* (2013.01); *F05D 2270/02* (2013.01); *F05D 2270/021* (2013.01); *F05D 2270/80* (2013.01)

(56) References Cited

U.S. PATENT DOCUMENTS

| | | |
|---|---|---|
| 4,020,685 A | 5/1977 | Van Millingen et al. |
| 4,099,237 A | 7/1978 | Zitelli |
| 4,183,242 A | 1/1980 | Brown |
| 4,345,191 A | 8/1982 | Takats et al. |
| 4,356,447 A | 10/1982 | Hönig et al. |
| 4,434,470 A | 2/1984 | Thomas et al. |
| 4,485,452 A | 11/1984 | Cording et al. |
| 4,494,207 A | 1/1985 | Chang et al. |
| 4,506,339 A | 3/1985 | Kühnlein |
| 4,554,788 A | 11/1985 | Hwang et al. |
| 4,602,515 A | 7/1986 | Eichenlaub |
| 4,635,209 A | 1/1987 | Hwang et al. |
| 4,712,372 A | 12/1987 | Dickey et al. |
| 4,715,009 A | 12/1987 | Böhmler et al. |
| 4,746,862 A | 5/1988 | Ueki |
| 4,774,845 A | 10/1988 | Barbe et al. |
| 4,788,647 A | 11/1988 | McManus et al. |
| 4,887,214 A | 12/1989 | Takats et al. |
| 4,955,269 A | 9/1990 | Kendig et al. |
| 4,972,332 A | 11/1990 | Luebbering et al. |
| 4,975,845 A | 12/1990 | Mehta |
| 5,165,271 A | 11/1992 | Stepper et al. |
| 5,371,460 A | 12/1994 | Coffman et al. |
| 5,508,609 A | 4/1996 | Parkinson et al. |
| 5,537,322 A | 7/1996 | Denz et al. |
| 5,559,705 A | 9/1996 | McClish et al. |
| 5,789,658 A | 8/1998 | Henn et al. |
| 5,933,005 A | 8/1999 | Pugh |
| 6,131,547 A | 10/2000 | Weber et al. |
| 6,292,717 B1 | 9/2001 | Alexander et al. |
| 6,445,995 B1 | 9/2002 | Mollmann |
| 6,727,686 B2 | 4/2004 | Beckmann et al. |
| 6,804,600 B1 | 10/2004 | Uluyol et al. |
| 8,100,000 B1 | 1/2012 | Rankin |
| 8,174,268 B2 | 5/2012 | Bose et al. |
| 8,222,760 B2 | 7/2012 | Menke |
| 8,352,149 B2 | 1/2013 | Meacham |
| 8,428,784 B2 | 4/2013 | Krueger |
| 8,464,598 B2 | 6/2013 | Cazaux et al. |
| 8,753,067 B2 | 6/2014 | Shindo |
| 9,140,718 B2 | 9/2015 | O'Neil et al. |
| 9,438,026 B2 | 9/2016 | Franks et al. |
| 9,708,926 B2 | 7/2017 | Curlier et al. |
| 10,371,072 B2 | 8/2019 | Gouzenne Coutier |
| 10,392,962 B2 | 8/2019 | Rowe et al. |
| 10,487,683 B2 | 11/2019 | Gerez et al. |
| 10,989,063 B2 | 4/2021 | Xiong et al. |
| 2003/0007861 A1 | 1/2003 | Brooks et al. |
| 2004/0050178 A1 | 3/2004 | Parkinson |
| 2008/0110283 A1 | 5/2008 | Shaver et al. |
| 2010/0088003 A1 | 4/2010 | Meacham |
| 2010/0324799 A1 | 12/2010 | Davison |
| 2013/0098042 A1 | 4/2013 | Frealle et al. |
| 2013/0289933 A1 | 10/2013 | Hess et al. |
| 2014/0070794 A1 | 3/2014 | Cosby et al. |
| 2014/0241850 A1 | 8/2014 | Duge |
| 2014/0260249 A1 | 9/2014 | Shapiro et al. |
| 2015/0096371 A1 | 4/2015 | O'Neil et al. |
| 2015/0211380 A1 | 7/2015 | Curlier et al. |
| 2016/0090918 A1 | 3/2016 | Certain |
| 2016/0291052 A1 | 10/2016 | Riolo et al. |
| 2017/0343575 A1 | 11/2017 | Brown et al. |
| 2017/0356300 A1 | 12/2017 | Domnick et al. |
| 2018/0003073 A1 | 1/2018 | Rowe et al. |
| 2018/0031594 A1 | 2/2018 | Joseph et al. |
| 2018/0050789 A1 | 2/2018 | Marone et al. |
| 2018/0050816 A1 | 2/2018 | Yakobov et al. |

FOREIGN PATENT DOCUMENTS

| | | |
|---|---|---|
| EP | 2273649 A1 | 1/2011 |
| EP | 3757355 A1 | 12/2020 |
| JP | 49-41706 A | 4/1974 |
| JP | 52-170233 U | 12/1977 |
| JP | 53-125502 A | 11/1978 |
| JP | 58-202308 A | 11/1983 |
| JP | 60-156909 A | 8/1985 |
| JP | 61-55303 A | 3/1986 |
| JP | 61-269615 A | 11/1986 |
| JP | 61-276036 A | 12/1986 |
| JP | 61-286504 A | 12/1986 |
| JP | 62-225704 A | 10/1987 |
| JP | 8-227317 A | 9/1996 |
| JP | 2000-249629 A | 9/2000 |
| JP | 2003-148108 A | 5/2003 |
| JP | 2003-336503 A | 11/2003 |
| JP | 2004-159496 A | 6/2004 |
| JP | 2007-224918 A | 9/2007 |
| JP | 2007-302090 A | 11/2007 |
| JP | 2008-157663 A | 7/2008 |
| JP | 2012-90422 A | 5/2012 |
| WO | WO 2012/064592 A2 | 5/2012 |
| WO | WO 2014/147832 A1 | 9/2014 |

OTHER PUBLICATIONS

Japan Patent Office, Office Action in Japanese Patent Application No. 2020-563458, 11 pp. (dated Jan. 5, 2022).
Japan Patent Office, Second Office Action in Japanese Patent Application No. 2020-563458, 11 pp. (dated Aug. 16, 2022).
Search Report and Written Opinion, PCT Appln. No. PCT/US19/31445, 5 pgs, dated Jul. 25, 2019.

TURBINE CONTROL SYSTEM

BACKGROUND

The present inventions relate generally to turbines, and more particularly, to a system for controlling a valve therein.

Electrical power plants employ large steam turbines to generate electricity. In a steam turbine, fast control of the valves may be particularly useful.

BRIEF DESCRIPTION OF SEVERAL VIEWS OF THE DRAWINGS

The invention may be more fully understood by reading the following description in conjunction with the drawings, in which.

DETAILED DESCRIPTION

Figure 1:
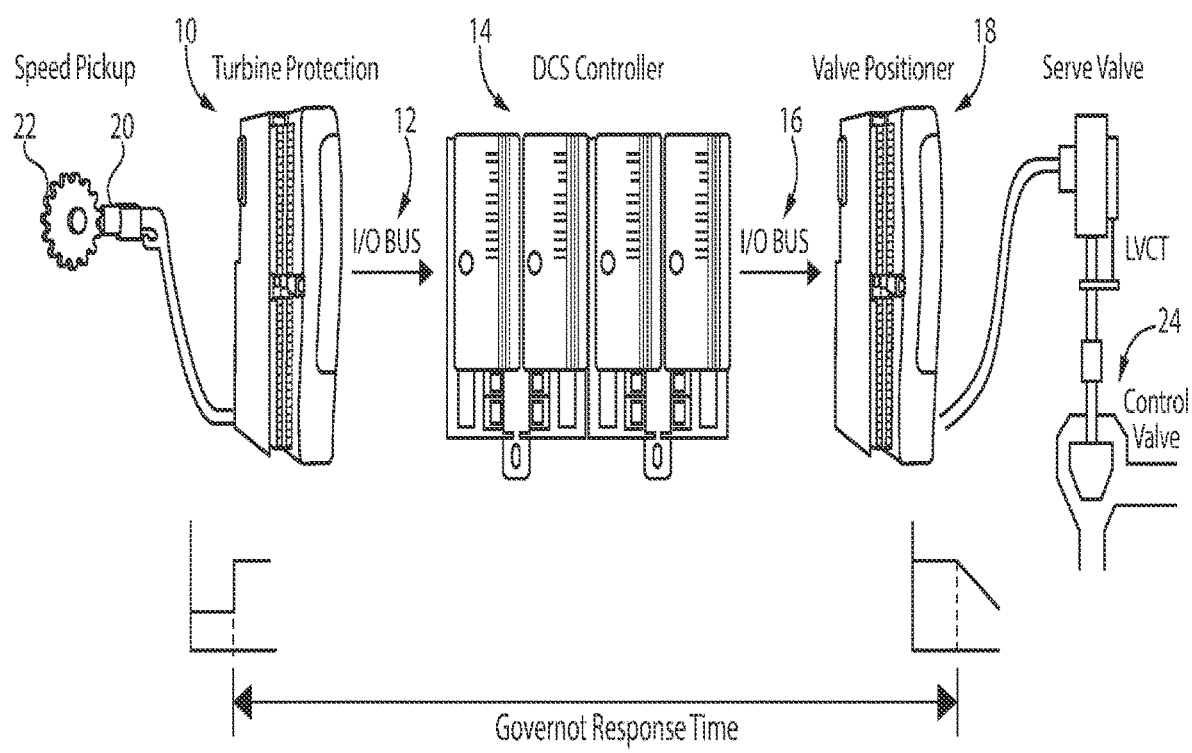
FIG. 1 is a schematic of a turbine control system.
Figure 2:
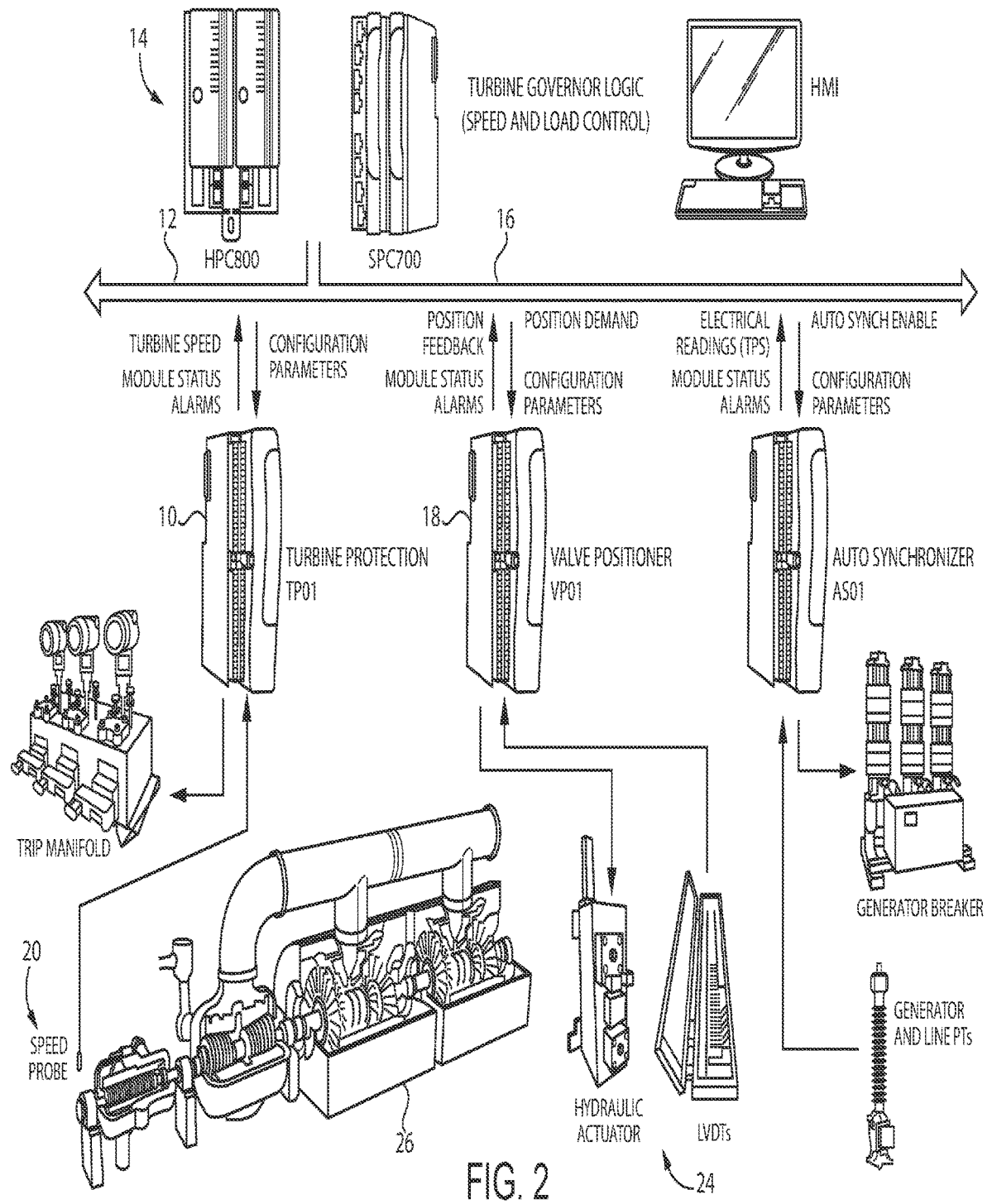
FIG. 2 is another schematic of the turbine control system.
Figure 3:
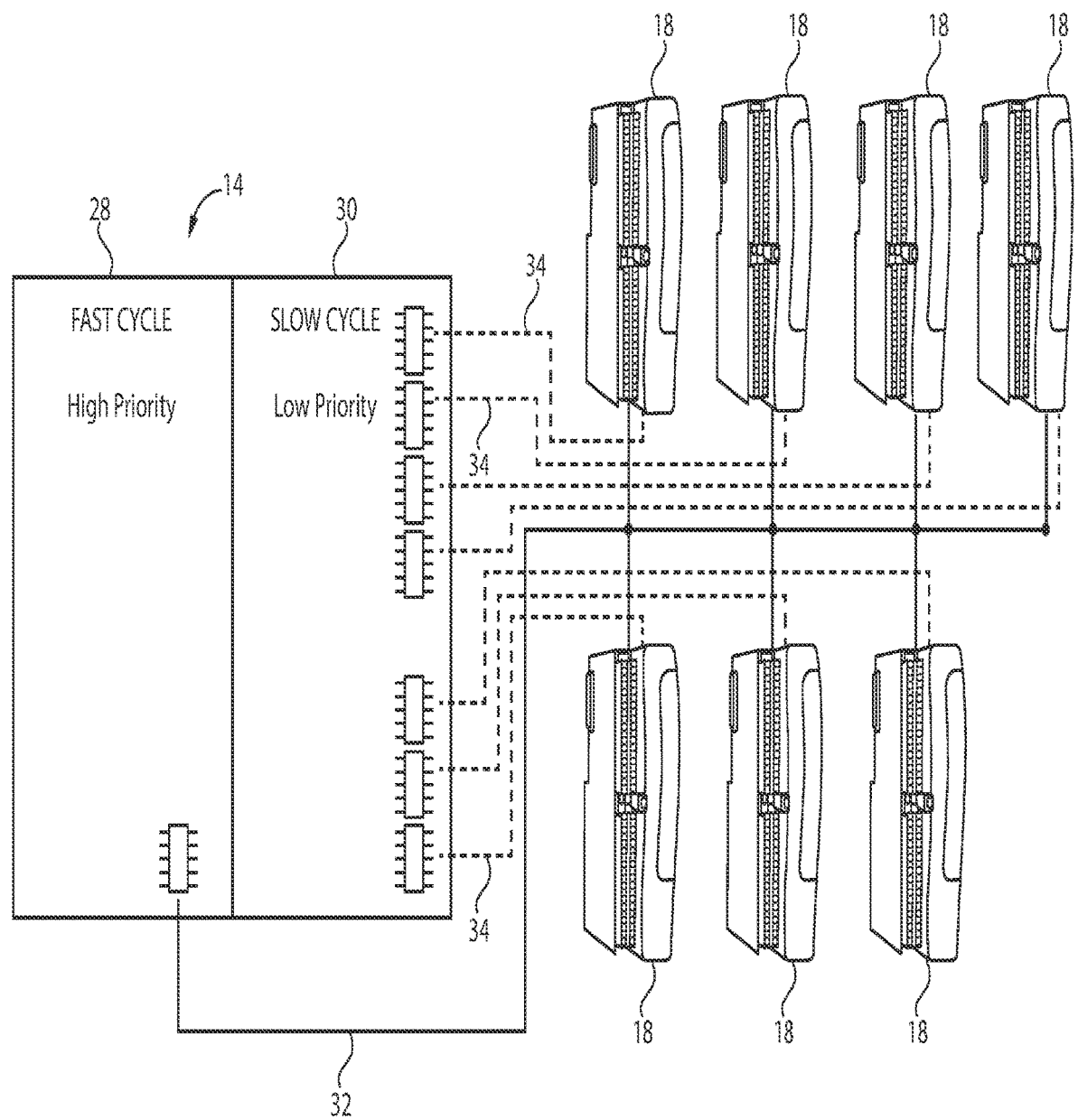
FIG. 3 is a schematic showing a fast cycle and a slow cycle of the controller and communication with a plurality of valve positioning modules.
Figure 4:
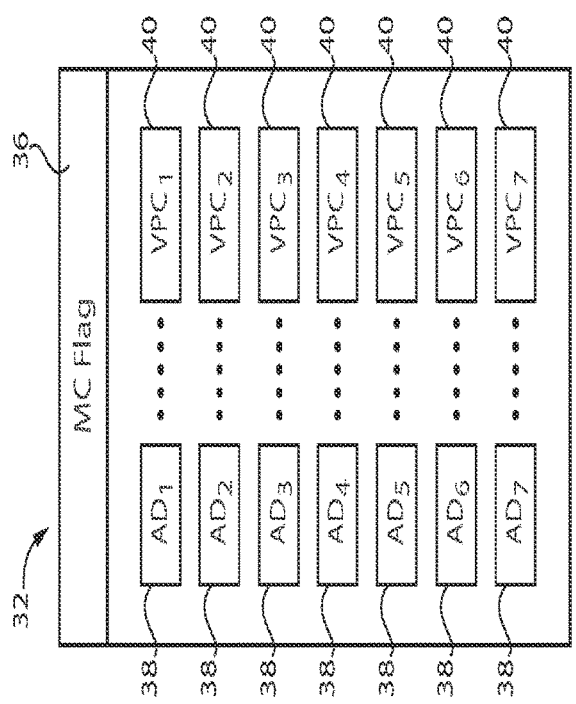
FIG. 4 is a schematic of a position packet generated by the fast cycle.
Figure 5:
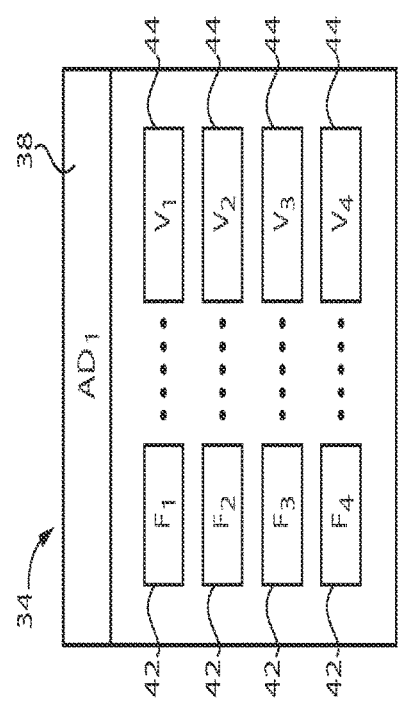
FIG. 5 is a schematic of a support function packet generated by the slow cycle.

One aspect of the preferred embodiments involves valve control multicasting. Turbine control systems require increasingly fast response times from their electronic governors in order to provide tight, responsive and safe turbine operation. The response time of the electronic governor is typically defined as the time delay from the moment the system reads the physical turbine speed signal to the moment the physical servo output signal is adjusted in direct response to the change in the speed input signal. As shown in FIG. 1, there are several elements in the governor control chain that affect the overall governor response time. The basic elements are 1) the turbine protection module reading and conditioning of the speed input signal (10); 2) the transmission of the speed signal to the main DCS controller via the I/O bus (12); 3) the execution of the control logic inside the DCS controller (including speed PID) (14); 4) the transmission of the valve position demand signal from the DCS controller over the I/O bus to the valve positioner (16); and 5) the execution of the valve positioning functions inside the valve positioner and the generation of the physical servo output signal (18).

Some prior systems used the controller to perform all the functions involving valve control. This included critical and non-critical tasks in addition to other functions the controller is required to perform. However, the preferred embodiments split the functions such that the critical functions are executed in a fast task or down at the I/O module level to greatly reduce execution time to a few milliseconds. Furthermore, less critical functions are executed in a slower task reducing the stress on the controller.

The principal applications for the preferred embodiments are generally large steam turbines at electrical power plants. The use of this application provides much faster control of multiple steam valves than traditional controls used in the past. The expected improvement is of the order of 10:1. Additionally, other applications that require faster control of valves could benefit from the preferred embodiments.

The biggest contributor to delays in the governor response time is the execution of the control logic inside the main DCS controller, which can vary from a few milliseconds to hundreds of milliseconds. The DCS controller executes governor functions such as speed control, load control, protection, fuel control, and communication interfaces to I/O modules. The last element, communication interfaces to I/O modules, can be a very significant burden on the DCS controller in systems with a large number of I/Os and more specifically a large number of valve positioner I/O modules. The communication interfaces to the valve positioner I/O modules can take several milliseconds for each instance, resulting in slow controller execution times and slow governor response times for turbine applications with a lot of fuel valves, which are representative of many steam and gas turbines.

One advantage of the preferred embodiments is greatly reduced execution time in a DCS controller. Another advantage is a reduced amount of logic required in the controller. Another advantage is discrimination between critical and non-critical functions inside the valve position I/O module.

The inventions as described herein may have one or more of the following features in addition to any of the features described above. Referring to the figures, the following features are shown.

A turbine control system including a speed probe 20 detecting a speed of a turbine 26; a turbine valve 24 controlling a flow of a fluid or a gas to or from the turbine 26; a controller 14 in communication with the speed probe 20 and the turbine valve 24, the controller 14 receiving a speed signal from the speed probe 20, and the controller 14 sending a first signal 32 and a second signal 34 to the turbine valve 24, the first signal 32 comprising a valve position command 40 to change a position of the turbine valve 24 in response to the speed signal and the second signal 34 comprising a support function 42 that does not command a change in position of the turbine valve 24 in response to the speed signal, wherein the controller 14 outputs the first signal 32 at a faster rate than the second signal 34.

The turbine control further comprising a speed wheel 22 attached to and rotatable with the turbine 26, the speed probe 20 identifying teeth of the speed wheel 22 as the teeth pass by the speed probe 20.

The turbine control further comprising a speed monitoring module 10, the speed monitoring module 10 being in communication with the speed probe 20, and the speed monitoring module 10 being in communication with the controller 14 through an I/O bus 12.

The turbine control system wherein the support function 42 comprises a diagnostic function, a feedback function, a calibration function or a test function and data 44 associated therewith.

The turbine control system wherein the controller 14 processes tasks in a fast cycle 28 and a slow cycle 30, the first signal 32 being processed in the fast cycle 28, and the second signal 34 being processed in the slow cycle 30.

The turbine control system further comprising a valve positioning module 18, the valve positioning module 18 being in communication with the turbine valve 24, and the valve positioning module 18 being in communication with the controller 14 through an I/O bus 16.

The turbine control system further comprising a plurality of the valve positioning module 18 and a plurality of the turbine valve 24, each of the valve positioning modules 18 being in communication with a separate one of the turbine valve 24, and the controller 14 separately communicates with each of the plurality of the valve positioning module 18 to send the second signal 34 comprising the support function 42, each of the support functions 42 thereby corresponding to a particular one of the plurality of the valve positioning module 18.

The turbine control system wherein each of the plurality of the turbine valve 24 comprises a fuel valve, a bypass valves, a stop valve or a governor valve.

The turbine control system wherein each of the plurality of the valve positioning module 18 comprises a separate circuit board and processor therein.

The turbine control system wherein the controller 14 communicates with the plurality of the valve positioning module 18 with packets 32, 34, each packet 32, 34 containing at least one address 38 associated with one of the plurality of the valve positioning module 18.

The turbine control system wherein the first signal 32 comprises a first type of packet 32 containing multiple addresses 38 associated with more than one of the plurality of the valve positioning module 18, the first type of packet 32 further containing one of the valve position command 40 for each of the multiple addresses 38.

The turbine control system wherein the first type of packet 32 contains a multicast flag 36 indicating that all of the plurality of the valve positioning module 18 must read the packet 32.

The turbine control system wherein the second signal 34 comprises a second type of packet 34 containing only one address 38 associated with only one of the plurality of the valve positioning module 18.

The turbine control system wherein the plurality of the valve positioning module 18 ignore the second type of packet 34 if the packet 34 does not contain the address 38 associated with the respective valve positioning module 18.

It is understood that the preferred embodiments described herein may be implemented as computerized methods in a non-transitory computer readable medium if desired.

While preferred embodiments of the inventions have been described, it should be understood that the inventions are not so limited, and modifications may be made without departing from the inventions herein. While each embodiment described herein may refer only to certain features and may not specifically refer to every feature described with respect to other embodiments, it should be recognized that the features described herein are interchangeable unless described otherwise, even where no reference is made to a specific feature. It should also be understood that the advantages described above are not necessarily the only advantages of the inventions, and it is not necessarily expected that all of the described advantages will be achieved with every embodiment of the inventions. The scope of the inventions is defined by the appended claims, and all devices and methods that come within the meaning of the claims, either literally or by equivalence, are intended to be embraced therein.

The invention claimed is:

1. A turbine control system, comprising:
a speed probe detecting a speed of a turbine;
a turbine valve controlling a flow of a fluid or a gas to or from the turbine;
a controller in communication with the speed probe and the turbine valve, the controller receiving a speed signal from the speed probe, and the controller sending a first signal and a second signal to the turbine valve, the first signal comprising a valve position command to change a position of the turbine valve in response to the speed signal and the second signal comprising a support function that does not command a change in position of the turbine valve in response to the speed signal,
wherein the controller outputs the first signal at a faster rate than the second signal.

2. The turbine control system according to claim 1, further comprising a speed wheel attached to and rotatable with the turbine, the speed probe identifying teeth of the speed wheel as the teeth pass by the speed probe.

3. The turbine control system according to claim 1, further comprising a speed monitoring module, the speed monitoring module being in communication with the speed probe, and the speed monitoring module being in communication with the controller through an I/O bus.

4. The turbine control system according to claim 1, wherein the support function comprises a diagnostic function, a feedback function, a calibration function or a test function and data associated therewith.

5. The turbine control system according to claim 1, wherein the controller processes tasks in a fast cycle and a slow cycle, the first signal being processed in the fast cycle, and the second signal being processed in the slow cycle.

6. The turbine control system according to claim 1, further comprising a valve positioning module, the valve positioning module being in communication with the turbine valve, and the valve positioning module being in communication with the controller through an I/O bus.

7. The turbine control system according to claim 6, further comprising a plurality of the valve positioning module and a plurality of the turbine valve, each of the valve positioning modules being in communication with a separate one of the turbine valve, and the controller separately communicates with each of the plurality of the valve positioning module to send the second signal comprising the support function, each of the support functions thereby corresponding to a particular one of the plurality of the valve positioning module.

8. The turbine control system according to claim 7, wherein each of the plurality of the turbine valve comprises a fuel valve, a bypass valves, a stop valve or a governor valve.

9. The turbine control system according to claim 7, wherein each of the plurality of the valve positioning module comprises a separate circuit board and processor therein.

10. The turbine control system according to claim 7, wherein the controller communicates with the plurality of the valve positioning module with packets, each packet containing at least one address associated with one of the plurality of the valve positioning module.

11. The turbine control system according to claim 10, wherein the first signal comprises a first type of packet containing multiple addresses associated with more than one of the plurality of the valve positioning module, the first type of packet further containing one of the valve position command for each of the multiple addresses.

12. The turbine control system according to claim 11, wherein the first type of packet contains a multicast flag indicating that all of the plurality of the valve positioning module must read the packet.

13. The turbine control system according to claim 10, wherein the second signal comprises a second type of packet containing only one address associated with only one of the plurality of the valve positioning module.

14. The turbine control system according to claim 13, wherein the plurality of the valve positioning module ignore the second type of packet if the packet does not contain the address associated with the respective valve positioning module.

15. The turbine control system according to claim 1, further comprising a valve positioning module, the valve positioning module being in communication with the turbine valve, and the valve positioning module being in communication with the controller through an I/O bus, further comprising a plurality of the valve positioning module and a plurality of the turbine valve, each of the valve positioning modules being in communication with a separate one of the turbine valve, and the controller separately communicates with each of the plurality of the valve positioning module to send the second signal comprising the support function, each of the support functions thereby corresponding to a particular one of the plurality of the valve positioning module, and wherein the controller processes tasks in a fast cycle and a slow cycle, the first signal being processed in the fast cycle, and the second signal being processed in the slow cycle.

16. The turbine control system according to claim 15, wherein the controller communicates with the plurality of the valve positioning module with packets, each packet containing at least one address associated with one of the plurality of the valve positioning module, and the first signal is contained in a first type of packet containing multiple addresses associated with more than one of the plurality of the valve positioning module, the first type of packet further containing one of the valve position command for each of the multiple addresses.

17. The turbine control system according to claim 16, wherein the first type of packet contains a multicast flag indicating that all of the plurality of the valve positioning module must read the packet.

18. The turbine control system according to claim 17, wherein the second signal is contained in a second type of packet containing only one address associated with only one of the plurality of the valve positioning module, and the plurality of the valve positioning module ignore the second type of packet if the packet does not contain the address associated with the respective valve positioning module.

19. The turbine control system according to claim 18, further comprising a speed wheel attached to and rotatable with the turbine, the speed probe identifying teeth of the speed wheel as the teeth pass by the speed probe, wherein the support function comprises a diagnostic function, a feedback function, a calibration function or a test function and data associated therewith, and each of the plurality of the valve positioning module comprises a separate circuit board and processor therein.

20. The turbine control system according to claim 1, further comprising a speed monitoring module, the speed monitoring module being in communication with the speed probe, and the speed monitoring module being in communication with the controller through an I/O bus, wherein each of the plurality of the turbine valve comprises a fuel valve, a bypass valves, a stop valve or a governor valve.

* * * * *